(12) United States Patent
Fischer

(10) Patent No.: US 7,385,455 B2
(45) Date of Patent: Jun. 10, 2008

(54) MONOLITHIC INTEGRATED CIRCUIT WITH INTEGRATED INTERFERENCE SUPPRESSION DEVICE

(75) Inventor: Harald Fischer, Bad-Ems (DE)

(73) Assignee: ATMEL Germany GmbH, Heilbronn (DE)

( * ) Notice: Subject to any disclaimer, the term of this patent is extended or adjusted under 35 U.S.C. 154(b) by 136 days.

(21) Appl. No.: 11/487,414

(22) Filed: Jul. 17, 2006

(65) Prior Publication Data
US 2007/0013037 A1 Jan. 18, 2007

(30) Foreign Application Priority Data
Jul. 16, 2005 (DE) .................... 10 2005 033 306

(51) Int. Cl.
*H04B 3/28* (2006.01)
(52) U.S. Cl. .................. 333/12; 333/204; 333/238; 333/246
(58) Field of Classification Search ............. 333/12, 333/204, 238, 246; 257/659, 664
See application file for complete search history.

(56) References Cited

U.S. PATENT DOCUMENTS

| | | | |
|---|---|---|---|
| 5,063,362 A * | 11/1991 | Herman et al. ............. | 333/12 |
| 6,307,252 B1 | 10/2001 | Knoedl, Jr. | |
| 6,489,866 B1 * | 12/2002 | Uchida et al. ............. | 333/247 |
| 6,731,189 B2 * | 5/2004 | Puzella et al. ............. | 333/246 |
| 6,882,210 B2 | 4/2005 | Asano et al. | |
| 7,091,802 B2 * | 8/2006 | Ham et al. .................. | 333/246 |
| 2004/0036165 A1 | 2/2004 | Ammar | |
| 2006/0170518 A1 * | 8/2006 | Chang ........................ | 333/185 |

FOREIGN PATENT DOCUMENTS

EP 1 251 561 A2 10/2002

OTHER PUBLICATIONS

S. Amari et al., "New Parallel λ/2-Microstrip Line Filters With Transmission Zeros at Finite Frequencies," 2003 IEEE MTT-S Digest, pp. 543-546.

* cited by examiner

*Primary Examiner*—Hoang V Nguyen
(74) *Attorney, Agent, or Firm*—Muncy, Geissler, Olds & Lowe, PLLC

(57) ABSTRACT

The invention discloses a monolithic integrated circuit with at least one signal connection carrying a signal and with an interference suppression device integrated in the circuit to reduce radiated interference. The interference suppression device has at least one stripline having a section whose beginning is coupled to the signal connection and whose end is short-circuited, wherein a length of the section is chosen as a function of a predefinable frequency, in particular as a function of a frequency of the radiated interference that is to be suppressed.

18 Claims, 2 Drawing Sheets

MONOLITHIC INTEGRATED CIRCUIT WITH INTEGRATED INTERFERENCE SUPPRESSION DEVICE

This nonprovisional application claims priority under 35 U.S.C. § 119(a) on German Patent Application No. DE 102005033306, which was filed in Germany on Jul. 16, 2005, and which is herein incorporated by reference.

BACKGROUND OF THE INVENTION

1. Field of the Invention

The present invention relates to a monolithic integrated circuit having at least one signal connection carrying a signal and having an interference suppression device integrated into the circuit to reduce radiated interference.

2. Description of the Background Art

Circuits of this nature are primarily based on a shielding of elements that are to be protected from radiated interference by electrical conductors which are to be arranged with the greatest possible area around the elements in question and are to be connected to a reference potential, in particular a ground potential of the circuit.

One example of such a prior art circuit is disclosed in U.S. Pat. No. 6,307,252 B1. There, a signal conductor that is to be protected from radiated interference is enclosed on three sides by conductors that serve as shielding and are electrically connected to one another.

The described arrangement, as well as other conventional circuits that are shielded in accordance with the Faraday principle, have the disadvantage that, firstly, a relatively large metal area is used inside the integrated circuit to form shielding conductors, and secondly, no targeted reduction of radiated interference or conducted interference at specific frequencies is possible.

SUMMARY OF THE INVENTION

It is therefore an object of the present invention to provide a monolithic integrated circuit such that it is possible to reduce radiated interference or conducted interference in a predefinable frequency range while at the same time using a relatively small metal area in the integrated circuit as compared with conventional circuits.

This object is attained in that a interference suppression device has at least one stripline having a section whose beginning is coupled to the signal connection and whose end is short-circuited, wherein a length of the section is chosen as a function of a predefinable frequency, in particular a frequency of the radiated interference that is to be suppressed.

Preferably, the length of the section of the stripline is chosen such that it corresponds to an integer multiple of half the wavelength corresponding to a frequency of the radiated interference that is to be suppressed. In this way, the short circuit located at the end of the section is transformed by the stripline into a short circuit at the beginning of the section of the stripline, so that, for example, interference signals at the corresponding frequency that are coupled into the stripline from the signal connection are short-circuited by the stripline at the beginning of the section.

Due to the relatively narrow-band action of the $\lambda/2$ transformer created in this way by the stripline, targeted suppression of radiated interference or interference signals is possible at the frequency for which the $\lambda/2$ transformer is designed. In contrast to an external shielding, i.e. one that, for example, completely surrounds the circuit, the invention permits interference suppression directly within the monolithic integrated circuit.

This type of frequency-selective interference suppression is especially useful when the circuit is intended for use in, for example, a system in which high-frequency interference sources of known frequency, for example oscillators or the like, are used. Through appropriate design of the stripline, the interference suppression device can be set up to allow maximum suppression of a certain frequency of the radiated interference emitted by the high-frequency interference source.

With a known power density spectrum of the radiated interference, such as is shown for purposes of illustration in FIG. 3, the power density can be influenced in a targeted manner over a specific frequency range, for example, in order to avoid exceeding maximum values of power density at predefined frequencies.

In an embodiment of the present invention, an impedance of the stripline is chosen such that power matching is provided for a predefinable frequency at the start of the section. This variant of the invention ensures that maximum interference power is coupled into the stripline and is thus diverted from the signal connection.

In another, advantageous embodiment of the present invention, a first conductor of the stripline is located in a first metallization level of the circuit and a second conductor of the same stripline is located in a second metallization level of the circuit. In this configuration of the stripline, an insulating layer located between the two metallization levels, which can for example be an oxide layer of the circuit, forms the dielectric, which among other things influences the impedance of the stripline. The effective dielectric constant of the stripline can be influenced through the choice of the insulating layer located between the two metallization levels, or also by the geometry of the individual conductors of the stripline. Starting from a predefined geometry of the conductors of the stripline, a resulting impedance of the stripline can be estimated using one of the known approximation formulas. However, depending upon the implementation of the circuit, differing impedances can, for example, result on account of the integration of the stripline in the monolithic integrated circuit, for which reason a numerical simulation of a planned interference suppression device is useful.

In another, embodiment of the interference suppression device, the stripline is embodied as a coplanar line in which all conductors of the stripline are located in a single metallization level of the circuit. Due to the design of the stripline as a coplanar line, the interference suppression device can also be provided in monolithic integrated circuits that have only a single metallization level.

In a further embodiment of the invention, it is also possible for the stripline to be embodied as a triplate line comprising three conductors, in which a first ground conductor and a second ground conductor of the triplate line are each arranged in different metallization levels. A signal conductor of the triplate line is located between the metallization levels that accommodate the ground conductors, preferably in another metallization level. An especially effective shielding of the signal conductor results when the above-described triplate line is used.

Another embodiment of the present invention provides multiple striplines, which can, for example, be employed for a single signal connection of the circuit as $\lambda/2$ transformers that each operate at different frequencies or wavelengths. It is possible with such an arrangement to suppress multiple predefinable frequencies of radiated interference at the same time in a targeted manner, thus permitting a more wide-band interference suppression as compared to the use of a single stripline.

In order to design each of the multiple striplines as a λ/2 transformer for a different frequency, the length of each stripline is selected as a function of the frequency or wavelength to be suppressed. Moreover, it is possible to provide different striplines with different impedances, for example by selecting insulating layer areas with different dielectric constants. Furthermore, the impedance of each stripline can be set individually through appropriate selection of the geometry of the relevant conductors.

It is also possible in accordance with the invention to provide a single stripline such that two different sections of the stripline are each configured differently with regard to their length to the relevant end or with regard to their impedance, so that in this way it is possible on the whole to realize with a single stripline, e.g., two λ/2 transformers, each of which is designed for a different frequency. In this configuration the beginning of each of the two sections is coupled in a known manner to the signal connection of the circuit, while, for example, the length of the first section is different from the length of the second section, which is likewise short-circuited at its end. Thus, in this case each of the two sections of the stripline represents a separate λ/2 transformer for the corresponding wavelength or frequency.

In another embodiment of the present invention, the stripline can be connected to the signal connection through means for capacitive coupling. The high-pass characteristic of a capacitive coupling prevents a low-frequency information signal from being coupled from the signal connection of the circuit into the stripline of the interference suppression device, while high-frequency interference signals can, however, be diverted from the signal connection to the stripline. A capacitance used to implement the capacitive coupling should accordingly be chosen as a function of the maximum frequency of the information signal appearing at the signal connection.

According to the invention, it is also possible to connect multiple signal connections of the circuit to the same stripline. In this way a stripline of the interference suppression device can substantially simultaneously serve to suppress interference on two or more signal connections of the circuit. In accordance with the preceding statements, the respective connection points should preferably be chosen such that at least one section of the stripline represents a λ/2 transformer for each signal connection.

In another embodiment of the present invention, the ground conductors of different striplines are located adjacent to one another, in particular parallel and/or orthogonal to one another, and are connected to a ground potential of the circuit in order to form a shield grid. In this embodiment of the present invention, use is made of the fact that the presence of multiple striplines also means that there will be a corresponding number of ground conductors that are connected to a ground potential of the circuit. In addition to their function in their respective striplines, these ground conductors can simultaneously also take on an extra function of shielding against radiated interference, which is especially effective when the multiple ground conductors are arranged adjacent to one another, parallel to one another, or even orthogonal to one another.

Such a shield grid of the ground conductors of different striplines, in addition to achieving frequency-selective interference suppression at the signal connections, also simultaneously provides general electrical shielding that works on the principle of a Faraday cage.

Also, the shield grid can at least partially cover a component of the circuit in order to shield radiated interference acting on the component and/or emitted by the component. In this way, emission of radiated interference from components located in the circuit can also be reduced by the shield grid. In particular, components such as integrated oscillators or DC-DC converters can be covered by the shield grid in order to reduce radiated interference emitted by the circuit, for example.

In a manner similar to the reduction of radiated interference emitted to the outside, the shield grid also provides protection for the circuit and/or components of the circuit from radiated interference that reaches the circuit from outside.

In general, the shielding effect achieved by the shield grid has a more wide-band nature than the action of a stripline designed as a λ/2 transformer, since all frequencies of radiated interference below a specific threshold frequency determined by the relative spacing of the ground conductors are shielded and/or damped by the shield grid. Accordingly, the respective spacing of the ground conductors of the striplines from one another should preferably be selected as a function of at least one frequency of radiated interference that is to be shielded and/or suppressed.

Multiple ground conductors can be located in the same metallization level of the circuit to form the shield grid. As an alternative thereto it is also possible to provide multiple ground conductors, in particular also arranged parallel to one another, in different metallization levels of the circuit, wherein these ground conductors are to be connected to one another by the contacts connecting the different metallization levels.

It is further possible to locate a first number of ground conductors in a first metallization level of the circuit and to locate a second number of ground conductors, which for example are each orthogonal to the ground conductors in the first metallization level, in a second metallization level of the circuit. The associated signal conductors of the striplines can each be located in the same metallization level, or else a different metallization level, of the circuit.

Because of the good shielding of the signal conductor, a stripline designed as a triplate line is especially suitable for constructing the shield grid.

In another embodiment of the present invention, all conductors of the stripline can be connected to one another and/or to a ground potential. In particular, in this embodiment the conductors can also be connected together directly in the area of the signal connection, so that the relevant signal connection is connected directly to a ground potential through the means for capacitive coupling, as a result of which all frequencies exceeding a threshold frequency defined by the coupling capacitance are diverted directly from the signal connection to ground.

In another embodiment of the present invention, the signal connection can be a bond pad of the circuit. It is especially useful, for example in an embodiment of the circuit as a transceiver for a data bus, for a bond pad that carries a communications signal for communication on the data bus, and is thus exposed in particular to greater conducted interference than other bond pads of the circuit, to be connected to the interference suppression device. For example, the circuit can be a CAN (controller area network) transceiver, LIN (local interconnect network) transceiver, or Flexray transceiver.

Overall, the interference suppression device makes possible a reduction in conducted interference, for example in the vicinity of a bond pad of the circuit, as well as a comparatively wide-band shielding of at least individual components of the circuit from radiated interference. As a result of the interference suppression device, both radiated interference acting on the circuit and radiated interference emitted by the circuit are reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
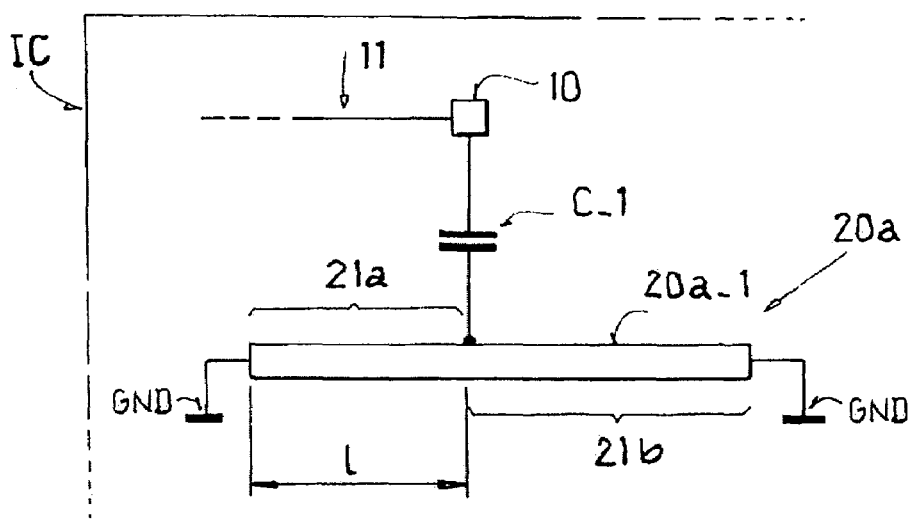
FIG. 1 illustrates an embodiment of the interference suppression device.

FIG. 1 shows a part of an interference suppression device monolithically integrated into an integrated circuit IC, the interference suppression device has a stripline 20a, wherein a signal connection of the circuit, embodied as a bond pad 10, is connected to a start of a first section 21a of the stripline 20a through a coupling capacitor C_1. At the end of the section 21a, the stripline 20a is short-circuited to ground GND. A signal line connected to the bond pad 10 is indicated in FIG. 1 by the line 11.

Figure 2A:
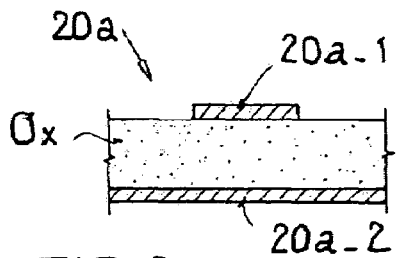
FIG. 2a is a cross-section through a stripline monolithically integrated into the circuit, according to an embodiment of the present invention.

Overall, the stripline 20a has the signal line 20a_1 already shown in FIG. 1, as well as an associated ground conductor 20a_2, not shown in FIG. 1, which is visible from the cross-section of the stripline 20a shown in FIG. 2a. Located as a dielectric between the conductors 20a_1, 20a_2 of the stripline 20a is an oxide layer Ox which is a part of the monolithic integrated circuit.

In accordance with the invention, the length l of the section 21a of the stripline 20a (FIG. 1) is chosen such that the short circuit to ground GND from the end of the section 21a is transformed by the section 21a of the stripline 20a into a short circuit at the start of the section 21a, which is connected through the coupling capacitor C_1 to the bond pad 10 of the circuit. In other words, the stripline 20a is used as a $\lambda/2$ transformer, $l=\lambda/2$.

The frequency or wavelength $\lambda$ for which the stripline 20a is to function as a $\lambda/2$ transformer is chosen as a function of an interference signal that is present at the bond pad 10, for example in the form of conducted interference or as a result of incoming radiated interference, and that is to be reduced or suppressed by the interference suppression device. As a result of the relatively narrow-band action of the $\lambda/2$ transformer formed by the stripline 20a, targeted interference suppression is possible for a specific frequency or wavelength.

Figure 3:
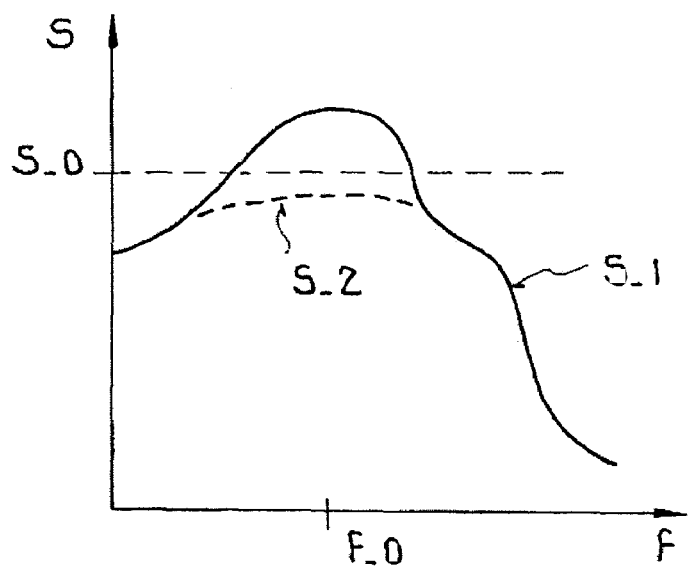
FIG. 3 shows a power density spectrum of radiated interference.

The function of the interference suppression device is described below by way of example with reference to FIG. 3. FIG. 3 shows a power density spectrum measured in the vicinity of the bond pad 10 (FIG. 1), in which a power density S is plotted over the frequency f. The curve labeled S_1 here shows the power density spectrum for the case in which no interference suppression device is provided in the circuit. As can be seen from FIG. 3, the power density S_1 in this case exceeds a maximum permissible value S_0, especially in a frequency range around the frequency f_0. In contrast thereto, the use of the interference suppression device and a corresponding design of the stripline 20a as a $\lambda/2$ transformer for the frequency f_0 result in the behavior of the power density spectrum indicated in FIG. 3 by the dashed curve S_2. Consequently, the use of the interference suppression device, monolithically integrated into the circuit in the form of the aforementioned stripline 20a, permits efficient suppression or reduction of radiated interference in the vicinity of the bond pad 10.

In addition to conducted interference, which is diverted directly through the coupling capacitor C_1 (FIG. 1) to the stripline 20a, radiated interference components acting on the bond pad 10, or on its electrical supply lines 11 and the like which may be present, as for example bond wires, can also be suppressed or reduced by the interference suppression device. Both radiated interference components radiated into the circuit from outside and radiated interference emitted, for example, by active components present in the circuit, can be suppressed with the interference suppression device.

In the stripline 20a depicted in FIG. 1, along with the section 21a there is provided an additional section 21b, which in FIG. 1 extends to the right from the start of the section 21a and is likewise short-circuited to ground GND at its end. The second section 21b of the stripline 20a preferably has a length different from the length l of the first section 21a, and thus can be used as a $\lambda/2$ transformer for an additional frequency of radiated interference that is to be suppressed.

For interference signals of a first frequency f_0 (FIG. 3) that are to be suppressed, the sections 21a, 21b of the stripline 20a form a parallel circuit of a short circuit produced by the first section 21a, designed as a $\lambda/2$ transformer for the frequency f_0, and a nonzero impedance produced by the second section 21b, since the second section is designed as a $\lambda/2$ transformer for another frequency. This means that the two sections 21a, 21b of the stripline 20a do not affect each other's action as $\lambda/2$ transformers for their respective frequencies.

The bandwidth of the interference suppression device can be increased by the combination of the sections 21a, 21b.

However, as an alternative thereto, it is also possible for the stripline 20a to have only one of the two sections 21a, 21b.

Figure 2B:
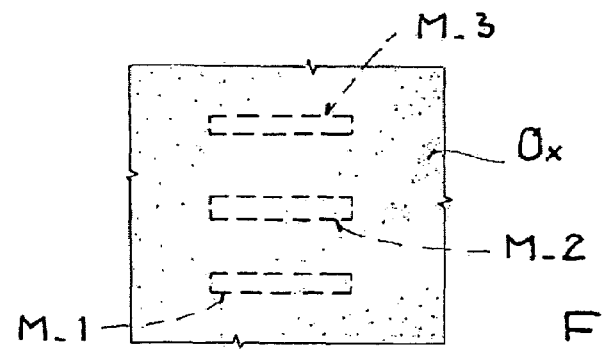
FIG. 2b is a layer structure of a part of the circuit, according to an embodiment.

FIG. 2b shows a layer structure of a part of the circuit, in which a total of three metallization levels M_1, M_2, M_3 are located one above the other within an oxide layer Ox. A substrate, located below the oxide layer Ox in the representation shown in FIG. 2b, and containing active components of the circuit, as for example transistors, voltage regulators, oscillators or the like, is not shown in FIG. 2b.

In accordance with the present example embodiment, the stripline 20a shown in FIG. 1 is implemented in the metallization levels M_1, M_2 from FIG. 2b and an oxide layer located between them. For example, the ground conductor 20a_2 (FIG. 2a) of the stripline 20a is implemented in the first metallization level M_1 from FIG. 2b, while the signal conductor 20a_1 (FIG. 2a) of the stripline 20a is located in the second metallization level M_2 from FIG. 2b, which is indicated in FIG. 2b above the first metallization level M_1.

A connection of a conductor 20a_1, 20a_2 of the stripline 20a to a ground potential and/or the coupling capacitor C_1 (FIG. 1), or to another connection point, is implemented in a conventional manner through-contact elements, which are not shown.

In general, different metallization levels M_1, M_2, M_3 of the circuit can be used to implement the respective conductors 20a_1, 20a_2 of the stripline 20a, depending on the design of the stripline 20a. Thus, the interference suppression device results in a variety of options for arranging the stripline 20a in the circuit.

Figure 2C:
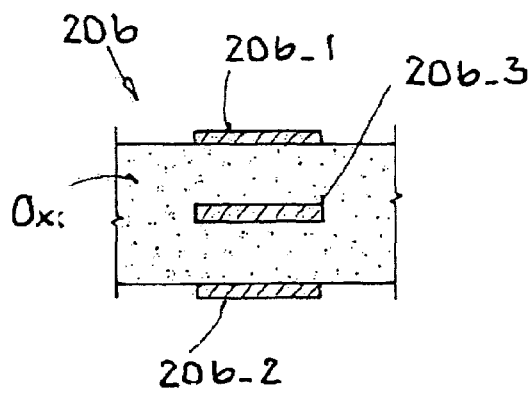
FIG. 2c is a cross-section of a stripline monolithically integrated into the circuit, according to another embodiment of the present invention.

In a stripline 20b embodied as a triplate line, whose cross-section is shown in FIG. 2c for purposes of illustration, the signal conductor 20b_3 is located between the two ground conductors 20b_1, 20b_2 and in this way is especially well-shielded from other parts of the circuit. The signal conductor 20b_3 of the triplate line 20b shown in FIG. 2c can, for example, be located in the second metallization level M_2 of the circuit (see also FIG. 2b), while the ground conductors 20b_1, 20b_2 are implemented in the first and third metallization levels M_1, M_3 of the circuit.

Figure 2D:
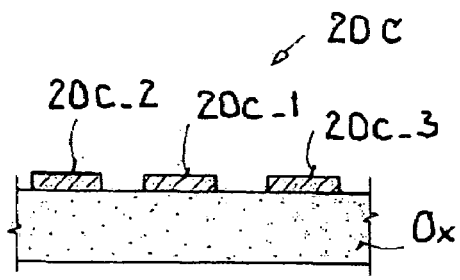
FIG. 2d is a cross-section through another embodiment of a stripline monolithically integrated into the circuit.

In a stripline 20c embodied as a coplanar line as shown in FIG. 2d, the signal conductor 20c_1 and also the two ground conductors 20c_2, 20c_3 surrounding the signal conductor are located in the same metallization level of the circuit, which for example can be the first metallization level M_1 as shown in FIG. 2b. Accordingly, the coplanar line 20c can be especially useful for implementing the interference suppression device in circuits having only one metallization level.

In general, multiple striplines 20a, 20b, 20c can also be provided in the interference suppression device and can be monolithically integrated into the integrated circuit, whereby, for example, one stripline 20a, 20b, 20c can be connected to each bond pad 10, or other connection of the circuit, that is to be protected from radiated interference. Moreover, multiple striplines 20a, 20b, 20c, preferably having different electrical lengths, can also be connected to one bond pad 10, so that these different striplines 20a, 20b, 20c each act as λ/2 transformers for different frequencies, permitting more wide-band interference suppression at the bond pad 10 than a single stripline.

In another embodiment of the present invention, an impedance of the stripline 20a, 20b, 20c is chosen such that power matching is provided for a predefinable frequency at the start of the section 21a, 21b (FIG. 1), so that maximum interference power can be diverted from the bond pad 10.

In addition to the possibility of equipping different striplines 20a, 20b, 20c of the interference suppression device with different lengths, it is also possible for each of the different striplines 20a, 20b, 20c to have different impedances. Different impedances can be achieved, for example, by changing the geometry of the conductors of the relevant striplines 20a, 20b, 20c, or by appropriate selection of the dielectric located between the conductors of the stripline 20a, 20b, 20c.

In place of the capacitive coupling of the bond pad 10 to the stripline 20a by the coupling capacitor C_1, as shown in FIG. 1, it is also conceivable according to the invention to connect the bond pad 10 directly to the stripline 20a, i.e. to connect them together galvanically. This solution is especially useful when an information signal present at the bond pad 10 is a high-frequency bandpass signal for whose signal frequency the stripline 20a or its section 21a transforms the short circuit to ground GND present at the end of the section 21a (FIG. 1) into a nonzero impedance, in which case the coupling capacitor C_1 can be spared.

It is also possible to connect multiple signal connections 10 of the circuit to the same stripline 20a. In this way, one stripline 20a of the interference suppression device can substantially simultaneously serve to suppress interference for two or more signal connections 10 of the circuit.

Figure 4:
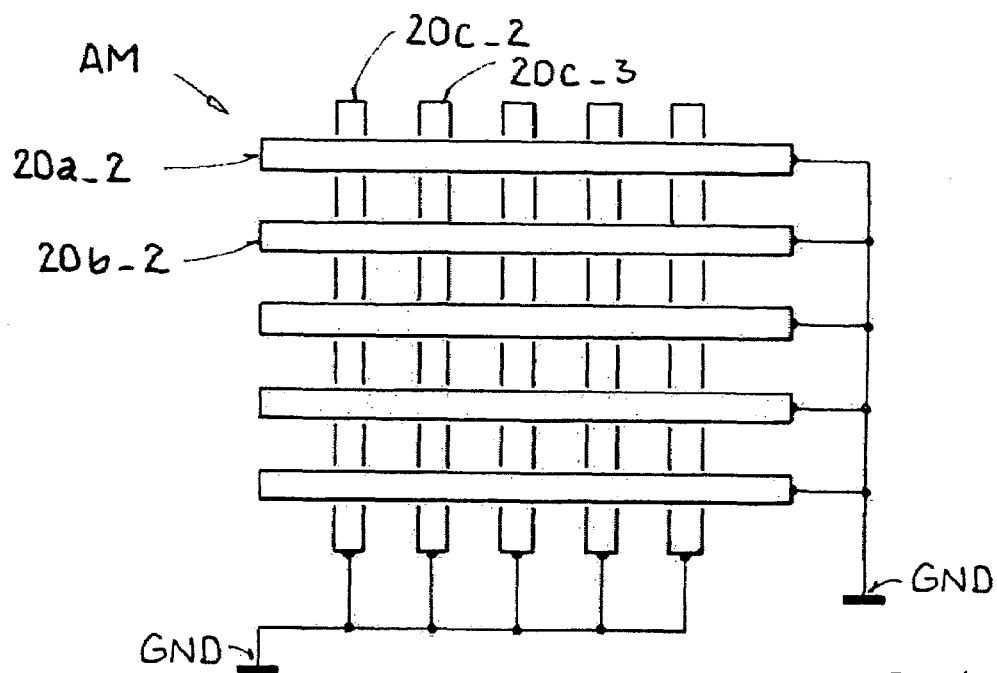
FIG. 4 is a shield grid formed by multiple ground conductors of striplines provided in a circuit, according to an embodiment of the present invention.

In another embodiment of the present invention, multiple ground conductors 20a_2, 20b_2, 20c_2, 20c_3 of different striplines 20a, 20b, 20c, as shown in FIG. 4, are located adjacent or orthogonal to one another and are connected to a ground potential GND of the circuit in order to form a shield grid AM in this manner.

As can be seen in FIG. 4, the ground conductors 20a_2, 20b_2, and other ground conductors located parallel thereto and not shown in detail, form a group of ground conductors arranged horizontally in FIG. 4, all of which are connected to the ground potential GND of the circuit. Provided orthogonal thereto are the ground conductors 20c_2, 20c_3, and other ground conductors located parallel thereto and not shown in detail in FIG. 4, all of which are likewise connected to the ground potential GND of the circuit. The ground conductors 20a_2, 20b_2 that are arranged horizontally in FIG. 4 are, for example, implemented in a first metallization level M_1 (FIG. 2b) of the circuit, while the ground conductors 20c_2, 20c_3 that are arranged vertically in FIG. 4 are implemented in the second metallization level M_2 (FIG. 2b) of the circuit. Moreover, it is possible to connect the ground conductors 20a_2, 20b_2, 20c_2, 20c_3 to one another by appropriate through-contacts.

Such a shield grid AM formed by the ground conductors provides effective protection for the circuit from both incoming and outgoing radiated interference. Frequency-selective interference suppression by the design of the stripline 20a as a λ/2 transformer, such as is described above with reference to FIG. 1, is not impaired by the configuration of the ground conductors shown in FIG. 4. The signal conductors associated with the ground conductors 20a_2, 20b_2, 20c_2, 20c_3 illustrated in FIG. 4 are not shown in FIG. 4, but can be located in different metallization levels of the circuit or in the same level as the associated ground conductors, depending on the design of the relevant stripline.

Figure 5:
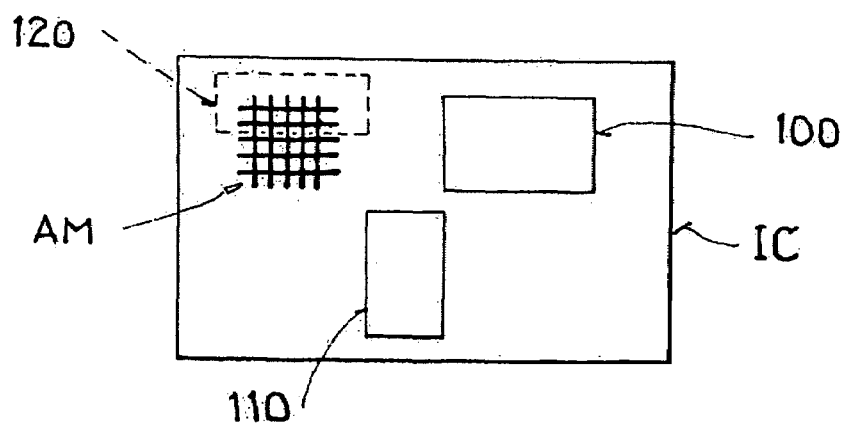
FIG. 5 illustrates an embodiment of the circuit with a shield grid from FIG. 4.

The shield grid AM can be intentionally located in an area of the circuit that is to be protected from incoming radiated interference, or whose outgoing radiated interference is to be reduced. A corresponding arrangement is shown in FIG. 5, which contains an extremely simplified top view of the integrated circuit IC having multiple components 100, 110, 120. The component 120 is an oscillator that is integrated into the circuit IC and is present, for example, to produce a reference signal for the circuit IC, and that emits radiated interference at a frequency f_0 (FIG. 3). In order to shield the radiated emission from the oscillator 120 such that prescribed limit values for the radiated interference emitted by the circuit IC are not exceeded, the shield grid AM is located in the circuit IC such that it at least partially covers the oscillator 120.

It is especially advantageous for a spacing between the ground conductors 20a_2, 20b_2, 20c_2, 20c_3 (FIG. 4) to be selected as a function of the frequency f_0 of the radiated interference to be shielded. With a sufficiently small spacing, corresponding for example to approximately one eighth of the wavelength of the radiated interference to be suppressed, the shield grid AM produces at least a partial shielding of the circuit IC according to the Faraday principle; this shielding is relatively wide-band in comparison to the interference suppression of a stripline 20a designed as a λ/2 transformer.

In addition to a shielding of radiated interference emitted by the oscillator 120, the shield grid AM also achieves a shielding of radiated interference acting on the oscillator 120.

Accordingly, the shield grid AM can also be located over additional components 100, 110 of the circuit IC in order to protect them from radiated interference from external components or other interference sources or the like.

In addition to the shielding based on the Faraday principle, the frequency-selective interference suppression by the individual striplines of the shield grid AM, according to FIG. 1, is also provided.

In another embodiment of the present invention, all conductors of the stripline 20a are connected together and/or to a ground potential GND, and in particular, directly in the area of a first bond pad 10 (FIG. 1), wherein the first bond pad 10 is preferably connected through a coupling capacitor C_1 to the stripline 20a or to the ground potential GND. In other words, in contrast to the embodiment shown in FIG. 1, the start of the section 21a is short-circuited to ground GND directly in the vicinity of the coupling capacitor C_1, and a point on the section 21a that is, e.g., separated by half a wavelength of the radiated interference to be suppressed, can be connected, for example, to another bond pad (not shown), preferably also through a coupling capacitor, and can divert interference from this additional bond pad in the manner described above.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit comprising:
   at least one signal connection for carrying a signal; and
   an interference suppression device being integrated in the circuit to reduce radiated interference, the interference suppression device having at least one stripline that includes a section whose beginning is coupled to the signal connection and whose end is short-circuited,
   wherein a length of the section is chosen as a function of a predefinable frequency or as a function of a frequency of the radiated interference that is to be suppressed.

2. The circuit according to claim 1, wherein the length of the section is an integer multiple of half the wavelength corresponding to the predefinable frequency.

3. The circuit according to claim 1, wherein an impedance of the stripline is chosen such that power matching is provided for a predefinable frequency at a start of the section.

4. The circuit according to claim 1, wherein a first conductor of the stripline is located in a first metallization level of the circuit and a second conductor of the same stripline is located in a second metallization level of the circuit.

5. The circuit according to claim 1, wherein the stripline is a coplanar line in which all conductors of the stripline are located in a single metallization level of the circuit.

6. The circuit according to claim 1, wherein the stripline is a triplate line comprising three conductors, in which a first ground conductor and a second ground conductor of the triplate line are each arranged in different metallization levels, and wherein a signal conductor of the triplate line is located between the metallization levels that accommodate the ground conductors or in an additional metallization level.

7. The circuit according to claim 1, wherein multiple striplines are provided.

8. The circuit according to claim 7, wherein the multiple striplines each have different lengths and/or impedances.

9. The circuit according to claim 7, wherein a dielectric with a different dielectric constant is provided between the conductors of each of the different striplines.

10. The circuit according to claim 7, wherein the ground conductors of different striplines are located adjacent to one another, in parallel and/or orthogonal to one another, and are connected to a ground potential of the circuit to form a shield grid.

11. The circuit according to claim 10, wherein the shield grid at least partially covers a component of the circuit to shield radiated interference acting on the component and/or radiated interference emitted by the component.

12. The circuit according to claim 10, wherein a spacing of the ground conductors from one another is selected as a function of at least one frequency of radiated interference that is to be shielded.

13. The circuit according to claim 10, wherein multiple ground conductors of the shield grid are located in the same metallization level and/or are connected to one another.

14. The circuit according to claim 1, wherein the stripline is connected to the signal connection via a capacitive coupling.

15. The circuit according to claim 14, multiple signal connections are connected to the same stripline.

16. The circuit according to claim 14, wherein all conductors of the stripline are connected to one another and/or to a ground potential in the area of the signal connection.

17. The circuit according to claim 1, wherein the signal connection is a bond pad of the circuit.

18. The integrated circuit according to claim 1, wherein the circuit is a monolithic integrated circuit.

* * * * *